United States Patent
Sindalovsky et al.

(10) Patent No.: US 8,816,776 B2
(45) Date of Patent: Aug. 26, 2014

(54) LOSS OF LOCK DETECTOR FOR CLOCK AND DATA RECOVERY SYSTEM

(71) Applicant: LSI Corporation, Milpitas, CA (US)

(72) Inventors: Vladimir Sindalovsky, Perkasie, PA (US); Mohammad S. Mobin, Orefield, PA (US); Lane A. Smith, Easton, PA (US)

(73) Assignee: LSI Corporation, San Jose, CA (US)

( * ) Notice: Subject to any disclaimer, the term of this patent is extended or adjusted under 35 U.S.C. 154(b) by 57 days.

(21) Appl. No.: 13/675,520

(22) Filed: Nov. 13, 2012

(65) Prior Publication Data

US 2014/0132320 A1    May 15, 2014

(51) Int. Cl.
*H03L 7/085* (2006.01)
*H04L 7/033* (2006.01)
*H03L 7/087* (2006.01)

(52) U.S. Cl.
CPC ............. *H03L 7/087* (2013.01); *H04L 7/033* (2013.01); *Y10S 331/02* (2013.01)
USPC ........... 331/1 A; 331/DIG. 2; 331/16; 331/34; 327/141; 327/144; 327/146; 327/147; 327/148; 375/373; 375/375; 375/376; 375/354

(58) Field of Classification Search
CPC .................................. H04L 7/00; H04L 27/06
USPC ......... 375/354, 355, 356, 359, 360, 362, 371, 375/373, 375, 376; 327/91, 94, 141, 144, 327/146, 147, 148; 331/1 A, DIG. 2, 34, 16
See application file for complete search history.

(56) References Cited

U.S. PATENT DOCUMENTS

| | | | |
|---|---|---|---|
| 6,982,604 B2 | 1/2006 | Chung | |
| 7,668,271 B2* | 2/2010 | Kim et al. | ..................... 375/354 |
| 8,208,521 B2 | 6/2012 | Mobin et al. | |
| 2004/0232951 A1* | 11/2004 | Tan et al. | ..................... 327/105 |
| 2009/0168936 A1 | 7/2009 | Mobin et al. | |

OTHER PUBLICATIONS

J.L. Sonntag et al., "A Digital Clock and Data Recovery Architecture for Multi-Gigabit/s Binary Links," IEEE Journal of Solid-State Circuits, Aug. 2006, pp. 1867-1875, vol. 41, No. 8.
J. Lee et al., "Analysis and Modeling of Bang-Bang Clock and Data Recovery Circuits," IEEE Journal of Solid-State Circuits, Sep. 2004, pp. 1571-1580, vol. 39, No. 9.

* cited by examiner

*Primary Examiner* — Arnold Kinkead
(74) *Attorney, Agent, or Firm* — Ryan, Mason & Lewis, LLP

(57) ABSTRACT

An apparatus comprises a clock and data recovery system, and a loss of lock detector at least partially incorporated within or otherwise associated with the clock and data recovery system. The loss of lock detector is configured to generate a loss of lock signal responsive to phase adjustment requests generated for a clock signal in the clock and data recovery system. By way of example, the loss of lock signal may have a first logic level indicative of the phase adjustment requests occurring at a first rate associated with a lock condition and a second logic level indicative of the phase adjustment requests occurring at a second rate lower than the first rate. Absolute values of respective phase increments each associated with multiple up and down phase requests may be accumulated, and the loss of lock signal generated as a function of the accumulated phase increment absolute values.

22 Claims, 4 Drawing Sheets

LOSS OF LOCK DETECTOR FOR CLOCK AND DATA RECOVERY SYSTEM

BACKGROUND

A digital communication system receiver typically incorporates a clock and data recovery (CDR) system. Such a CDR system may be configured to process a received serial data stream in order to generate a clock signal that is used for data sampling. The CDR system usually includes a phase control loop that attempts to lock the clock signal frequency and phase to the frequency and phase of the received serial data stream. After a lock condition has been achieved, the phase control loop continues to adjust the clock signal frequency and phase so as to track the frequency and phase of the serial data stream. In the event of a loss of lock, the phase control loop has to re-lock to the serial data stream.

Accordingly, it is important to provide an accurate loss of lock detector for a CDR system. This allows the CDR system to efficiently initiate re-locking to the serial data stream in the event of a loss of lock. The loss of lock detector may provide a binary indicator signal having a first logic level indicating that the clock signal is properly locked to the serial data stream, and a second logic level indicating that the clock signal is not properly locked to the serial data stream.

Exemplary loss of lock detection techniques are disclosed in U.S. Pat. No. 8,208,521, entitled "Methods and Apparatus for Detecting a Loss of Lock Condition in a Clock and Data Recovery System," which is commonly assigned herewith and incorporated by reference herein. In one technique disclosed therein, a loss of lock condition is detected in a CDR system by sampling the received serial data stream for different phases using one or more latches clocked by the recovered clock signal, evaluating the samples to monitor a data eye associated with the serial data stream, and detecting the loss of lock condition if the data eye does not satisfy one or more predefined conditions. The corresponding loss of lock detector is also referred to herein as a rotational detector.

By way of example, the one or more predefined conditions can be selected to ensure that the additional data samples generated for the different phases have a deterministic pattern when the CDR system is in a lock condition. As a result, loss of lock can be detected by determining if the additional data samples have a non-deterministic pattern.

Despite the considerable advantages provided by the techniques disclosed in the above-cited U.S. patent, a need remains for further improvements in loss of lock detection for CDR systems.

SUMMARY

In one embodiment, an apparatus comprises a clock and data recovery system, and a loss of lock detector at least partially incorporated within or otherwise associated with the clock and data recovery system. The loss of lock detector is configured to generate a loss of lock signal responsive to phase adjustment requests generated for a clock signal in the clock and data recovery system. The loss of lock signal may be in the form of a binary signal having a first logic level indicative of the phase adjustment requests occurring at a first rate associated with a lock condition and a second logic level indicative of the phase adjustment requests occurring at a second rate lower than the first rate.

In generating the loss of lock signal, absolute values of respective phase increments each associated with multiple up and down phase requests may be accumulated in an accumulator, and the loss of lock signal generated as a function of the accumulated phase increment absolute values.

Also, filtering and hysteresis operations may be applied to an output signal of the accumulator prior to generating the loss of lock signal from that output signal.

Other embodiments of the invention include but are not limited to methods, integrated circuits, and storage media having executable computer program code embodied therein.

DETAILED DESCRIPTION

Embodiments of the invention will be illustrated herein in conjunction with exemplary CDR systems and associated loss of lock detectors that are based on phase adjustment dynamics. One or more such arrangements can provide enhanced loss of lock detection accuracy in the presence of serial data stream jitter while also exhibiting reduced circuit complexity, relative to conventional loss of lock detection arrangements.

It should be understood, however, that the disclosed arrangements are more generally applicable to any CDR system application in which it is desirable to provide improved generation of loss of lock indications. For example, embodiments of the invention can be implemented in any of a wide variety of processing devices and wired or wireless communication systems that utilize CDR systems.

Figure 1:
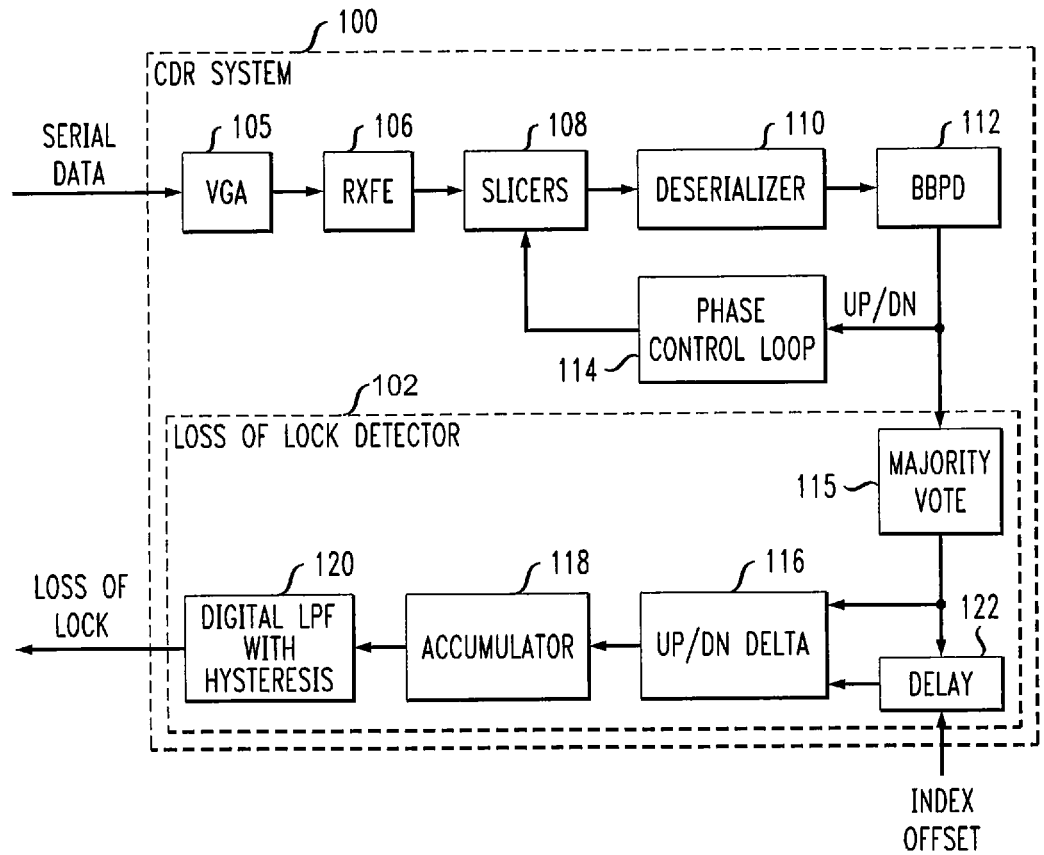
FIG. 1 is a block diagram showing an illustrative embodiment of a CDR system comprising a loss of lock detector based on phase adjustment dynamics

The following acronyms are utilized in this description:
ASIC Application-Specific Integrated Circuit
BBPD Bang-Bang Phase Detector
CDR Clock and Data Recovery
DSP Digital Signal Processor
FPGA Field-Programmable Gate Array
HDD Hard Disk Drive
IC Integrated Circuit
ISI Intersymbol Interference
LPF Low Pass Filter
RAM Random Access Memory
ROM Read-Only Memory
RXFE Receiver Front End
SOC System-On-Chip
UI Unit Interval
VGA Variable Gain Amplifier FIG. 1 shows a CDR system 100 in an illustrative embodiment. The CDR system 100 comprises a loss of lock detector 102. The loss of lock detector 102 in this embodiment is configured to generate a loss of lock signal responsive to phase adjustment requests generated for a clock signal in the CDR system 100. The loss of lock signal generated by the loss of lock detector 102 in the present embodiment is assumed to be a binary signal having first and second logic levels indicative of respective lock and loss of lock conditions. For example, the loss of lock signal may have a first logic level indicative of the phase adjustment requests occurring at a first rate associated with a lock condition and a second logic level indicative of the phase adjustment requests occurring at a second rate lower than the first rate, the second rate being associated with a loss of lock condition.

Although the loss of lock detector 102 is shown in FIG. 1 as being arranged internally to the CDR system 100, this is by way of illustrative example only, and in other embodiments the loss of lock detector 102 may be arranged externally to the CDR system 100, or some portions of the loss of lock detector 102 may be arranged internally to the CDR system 100 while other portions are arranged externally to the CDR system 100.

The CDR system 100 may be implemented, for example, in a mobile telephone, a computer, or any other type of communication device in a wired or wireless communication system. As another example, the CDR system 100 may be implemented in a system-on-chip (SOC) integrated circuit in a hard disk drive (HDD) controller application, designed for reading and writing data from one or more magnetic storage disks of an HDD. Numerous other applications are possible. Communication devices such as mobile telephones and storage devices such as HDDs are considered examples of what are more generally referred to herein as "processing devices." An embodiment of such a processing device will be described in greater detail below in conjunction with FIG. 8.

The CDR system 100 as illustrated in FIG. 1 is just one exemplary configuration of a CDR system that may incorporate or otherwise utilize a loss of lock detector based on phase adjustment dynamics as disclosed herein, and numerous alternative configurations of system elements may be used in other embodiments. For example, other embodiments of the invention may include additional or alternative elements of a type commonly associated with conventional CDR system implementations.

In the FIG. 1 embodiment, the CDR system 100 comprises, in addition to the loss of lock detector 102, a variable gain amplifier (VGA) 105, an analog receiver front end (RXFE) 106, slicer circuitry comprising a plurality of slicers 108, a deserializer 110, a phase detector 112 illustratively implemented as a binary or "bang-bang" phase detector (BBPD), and a phase control loop 114. The BBPD may more particularly be implemented using a tri-state configuration such as an Alexander topology.

A serial data stream received by the CDR system 100 is processed through VGA 105 and RXFE 106 and applied to the slicers 108. The slicers 108 sample the serial data stream using a sampling clock signal provided by the phase control loop 114 in order to obtain data information and possibly also transition information from the serial data stream. The sampling clock signal is an example of what is more generally referred to herein as a "clock signal."

The data information is used for data recovery as well as recovery of the sampling clock signal, and the transition information if obtained can be used to facilitate recovery of the phase of the sampling clock signal, as will be appreciated by those skilled in the art. The sampling clock signal phase is also referred to herein as simply "sampling phase." In an alternative embodiment utilizing a baud rate phase detector, data information and error information may be used to recover the sampling phase.

The samples from the slicers 108 are processed through deserializer 110 in order to reduce the data rate for further processing and to align samples taken at different times to a common time stamp. In other embodiments, the deserializer 110 may be eliminated and the samples from the slicers 108 provided directly to the phase detector 112.

Using the deserialized samples, the phase detector 112 generates phase adjustment requests and provides them to the phase control loop 114. These phase adjustment requests are based on up or down phase adjustment decisions made by the phase detector 112 in order to align the sampling phase to the middle of the serial data eye. Accordingly, the phase adjustment requests in the present embodiment are assumed to comprise both phase up requests and phase down requests, collectively denoted UP/DN in the figure, although other types of phase adjustment requests may be used in other embodiments. The term "phase adjustment request" as used herein is therefore intended to be broadly construed. The particular manner in which the phase adjustment requests change over time is generally referred to herein as the "phase adjustment dynamics" of the CDR system 100.

The phase control loop 114 in the present embodiment has an input coupled to an output of the phase detector 112 and an output providing the sampling clock signal to the slicers 108. The phase control loop 114 is configured to operate in conjunction with the phase detector 112 such that the sampling clock signal is locked to the serial data stream. In the present embodiment, the phase control loop 114 provides phase adjustment filtering of the phase adjustment requests provided by the phase detector 112 and may be implemented, for example, using a first order loop or a second order loop.

Figure 2A:
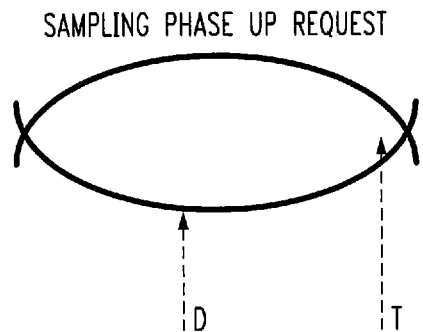
FIGS. 2A and 2B illustrate exemplary sampling phase decisions for respective phase up and phase down requests in the FIG. 1 CDR system.
Figure 2B:
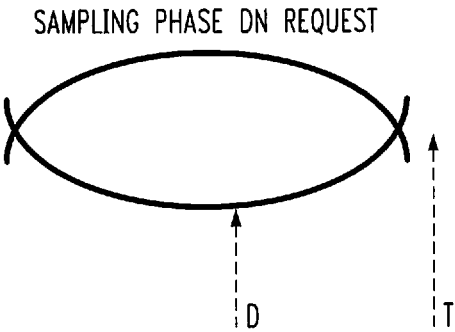

FIGS. 2A and 2B illustrate exemplary sampling phase decisions made by the phase detector 112 in generating respective phase up and phase down requests for delivery to the phase control loop 114 in the CDR system 100. In each of FIGS. 2A and 2B, D denotes a data sample and T denotes a transition sample.

In the case illustrated in FIG. 2A, both the data sample and the transition sample have the same logic value, which indicates that the sampling clock phase is misaligned in a first direction relative to the middle of the serial data eye. Responsive to detection of this situation, the phase detector 112 generates a phase up request. This phase up request generally directs the phase control loop 114 to adjust the sampling clock phase such that the data and transition sample points are moved to the right in the figure. As a result, the data sample point is better aligned with the middle of the serial data eye.

In the case illustrated in FIG. 2B, the data sample and the transition sample have different logic values, which indicates that the sampling clock phase is misaligned in a second direction, opposite the above-noted first direction, relative to the middle of the serial data eye. Responsive to detection of this situation, the phase detector 112 generates a phase down request. This phase down request generally directs the phase control loop 114 to adjust the sampling clock phase such that the data and transition sample points are moved to the left in the figure. Again, the data sample point is thereby better aligned with the middle of the serial data eye.

Figure 3:
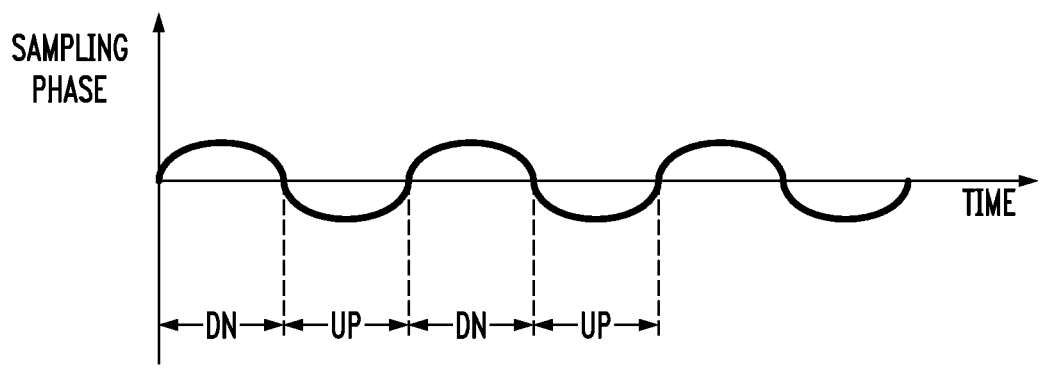
FIG. 3 is a plot of sampling phase as a function of time, illustrating locked phase adjustment dynamics of the FIG. 1 CDR system without serial data intersymbol interference (ISI) and eye sampling imperfections.

Due to the nature of the BBPD used in this embodiment as well as the latency of the phase control loop 114, the sampling phase is continuously adjusted up and down even under a lock condition in which the sampling clock signal is locked to the serial data stream. The corresponding phase adjustment dynamics are illustrated in FIG. 3, assuming no serial data ISI and eye sampling imperfections. In this example, the phase adjustment dynamics under the lock condition vary as shown between sequentially alternating periods of up and down requests as a function of time, primarily as a function of the latency and gain of the phase control loop 114. The alternating periods of up and down requests are roughly equivalent to the latency of the phase control loop 114, which is typically on the order of 20-30 Unit Intervals (UIs). Accordingly, it can be seen that under a lock condition, the down and up requests will generally follow a substantially fixed rate of variation.

Figure 4:
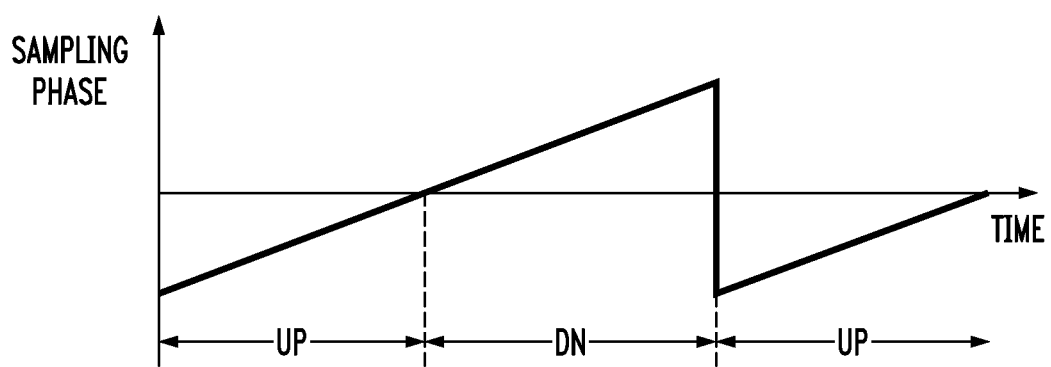
FIG. 4 is a plot of sampling phase as a function of time, illustrating unlocked phase adjustment dynamics of the FIG. 1 CDR system.

When the CDR system 100 is not locked to the serial data stream, the phase adjustment dynamics are significantly different than in the locked case illustrated in FIG. 2. More particularly, under a loss of lock condition, the duration of the periods of up and down requests will depend on the frequency offset between the serial data stream rate and the sampling clock rate. These unlocked phase adjustment dynamics are illustrated in FIG. 4. When the sampling clock phase is such that the sampling clock edge falls in the left half of the serial data eye, as in FIG. 2A, a phase up request is generated, and when the sampling clock phase is such that the sampling clock edge falls in the right half of the serial data eye, as in FIG. 2B, a phase down request is generated. This again causes sequentially alternating periods of up and down requests as a function of time, as illustrated in the figure, but the duration of each period is substantially greater than the period durations in the locked case.

The durations $T_{UP}$ and $T_{DN}$ of the respective up and down phase adjustment periods in the unlocked case illustrated in FIG. 4 can be expressed as follows:

$$T_{UP} = T_{DN} = \frac{1}{2 \cdot ppm \cdot 10^{-6}} UI$$

where ppm denotes the frequency offset in parts per million between the serial data stream rate and the sampling clock rate. For a typical maximum frequency offset of ppm=5,000 the durations of the up and down periods will be 100 UI, which is much longer than the durations of the up and down periods for the locked case, which as indicated above are typically 20-30 UI in the present embodiment. The loss of lock detector 102 is configured to detect loss of lock based at least in part on these substantial differences in phase adjustment dynamics between the locked and unlocked cases.

Figure 5:
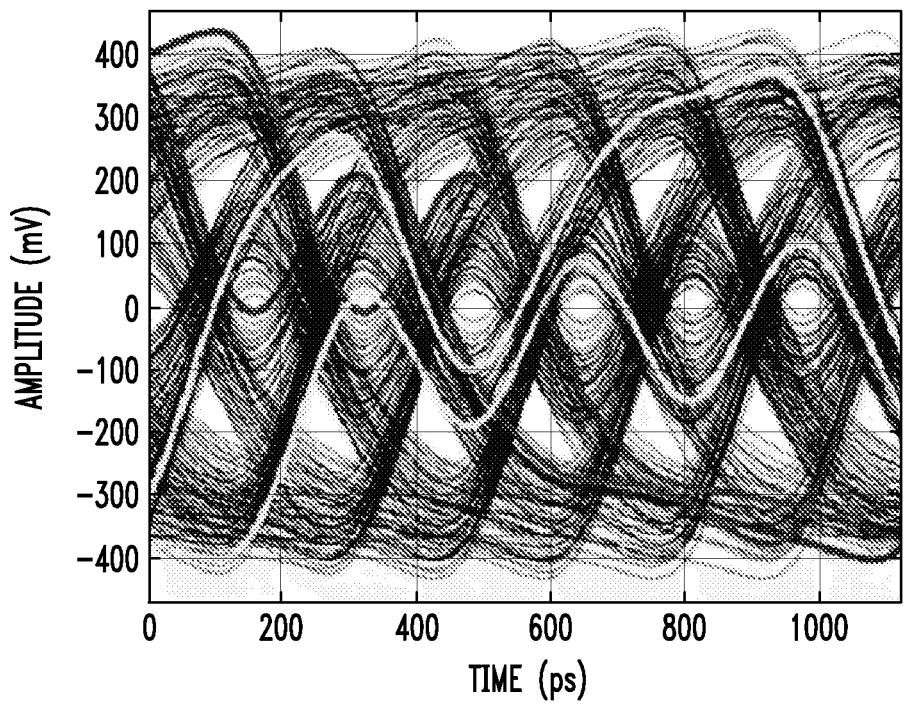
FIG. 5 shows an eye diagram of a serial data stream with ISI.

It was indicated above that the locked phase adjustment dynamics of FIG. 3 are illustrated under a simplifying assumption of no serial data ISI and eye sampling imperfections. However, in practice, serial data ISI and eye sampling imperfections are typically present, due at least in part to factors such as timing imperfections in the slicers 108, and connection media transfer functions. FIG. 5 shows an example of a serial data eye in the presence of ISI and eye sampling imperfections. It can be seen that the transition point has a relatively wide spread, which will tend to increase the rate of transition between the up and down phase adjustment periods, such that the locked phase adjustment dynamics are further distinct from the unlocked phase adjustment dynamics.

Figure 6:
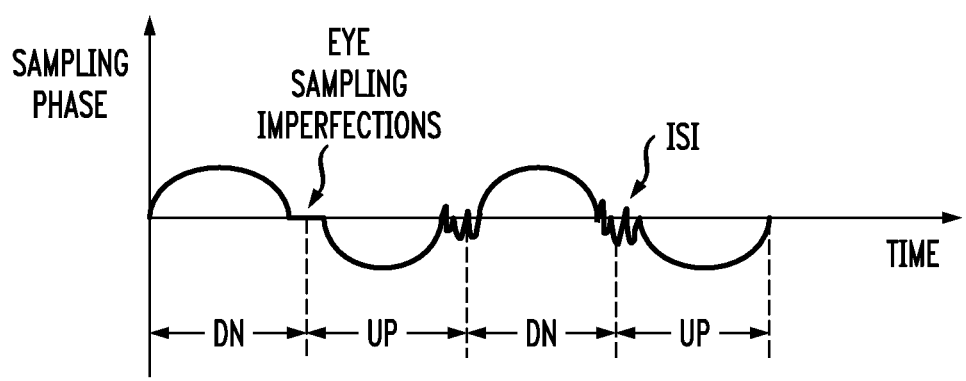
FIG. 6 is a plot of sampling phase as a function of time, illustrating locked sampling phase dynamics of the FIG. 1 CDR system with serial data ISI and eye sampling imperfections.

FIG. 6 illustrates the locked phase adjustment dynamics for the CDR system 100 in the presence of serial data ISI and eye sampling imperfections. As noted above, the serial data ISI tends to shorten the duration of the up and down periods. The eye sampling imperfections lead to conflicting phase adjustment information, thereby producing "dead zones" in which neither a phase up or phase down adjustment is indicated. Such dead zones are addressed in the present embodiment through manipulation of an index offset, as will be described in greater detail below.

As mentioned above, the significant differences in the phase adjustment dynamics between the locked and unlocked cases are utilized by the loss of lock detector 102 in generating the loss of lock signal in the CDR system 100, as will now be described in greater detail with reference to FIGS. 1 and 7.

The loss of lock detector 102 in the present embodiment comprises majority vote circuitry 115 configured to process request groups each comprising multiple phase up and phase down requests from the phase detector 112. More particularly, the majority vote circuitry 115 replaces a given request group with a single phase up request if the number of phase up requests in the group exceeds the number of phase down requests in the group, and replaces the given request group with a single phase down request if the number of phase down requests in the group exceeds the number of phase up requests in the group. Accordingly, the majority vote circuitry 115 processes groups of multiple phase up and phase down requests from the phase detector 112 and generates one up request if the number of up requests in a group exceeds the number of down requests and vice versa. This helps to reduce the effects of transition spread due to serial data ISI while also limiting the influence of the particular data pattern in the serial data stream.

The output of the majority vote circuitry 115 is coupled to an input of an UP/DN delta module 116. This module may be viewed as an example of what is more generally referred to herein as "differencing circuitry." Such circuitry is configured to compute an absolute value of a phase increment associated with a corresponding subset of the phase up and phase down requests. More particularly, in the present embodiment, the UP/DN delta module 116 calculates the absolute value of the phase increment between current and previous outputs of the majority vote circuitry 115 over a particular time period, which may be specified as a single period of a processing clock. Such a time period may correspond, for example, to a certain number of UIs, such as 4 UI or 8 UI. The output of the UP/DN delta module 116 generally exhibits its highest values when a particular period of consecutive up requests changes over to a period of consecutive down requests, and vice versa.

The output of the UP/DN delta module 116 is coupled to an input of an accumulator 118. The accumulator 118 accumulates the absolute values of respective phase increments over an accumulation interval, as these absolute values are supplied by the UP/DN delta module 116. The output of the accumulator is further processed in a digital low pass filter (LPF) 120 with hysteresis in order to generate the loss of lock signal at the output of the loss of lock detector 102. Although both filtering and hysteresis are applied in module 120 in this embodiment, other embodiments may utilize only filtering or only hysteresis in this output module of the loss of lock detector 102.

The loss of lock signal at the output of the loss of lock detector 102 is a binary signal having a first logic level indicative of a lock condition at least in part responsive to the output signal of the accumulator 118 being above a first threshold and a second logic level indicative of a loss of lock condition at least in part responsive to the output signal of the accumulator 118 being below a second threshold that is less than the first threshold. The first and second thresholds are also referred to herein as respective "on" and "off" thresholds, corresponding to respective lock and loss of lock conditions.

The digital LPF 120 may be implemented, for example, as a slew rate limiter. One exemplary form of such an LPF is as follows:

LPFout←LPFout+(LPFin−LPFout)/256.

It is to be appreciated, however, that a wide variety of other LPF configurations, or more generally filtering operations, may be used in embodiments of the invention.

The hysteresis operation applied to the accumulator output signal in digital LPF 120 may be implemented by associating a first counter with the first threshold and a second counter with the second threshold. In such an arrangement, the loss of lock signal has a first logic level indicative of a lock condition responsive to the output signal of the accumulator 118 exceeding the first threshold for at least a minimum period of time defined by the first counter and has a second logic level indicative of a loss of lock condition responsive to the output signal of the accumulator 118 falling below the second threshold for at least a minimum period of time defined by the second counter. This exemplary hysteresis arrangement requires the accumulated and low pass filtered UP/DN delta output to remain above the first threshold or below the second threshold for predefined periods of time before the logic level of the loss of lock signal is changed. The first counter is reset when the output signal of the accumulator falls below the second threshold and the second counter is reset when the output signal of the accumulator exceeds the first threshold.

The first and second counters may both be set, for example, to count a common predefined period of time given by a value such as 4088 UI, although a wide variety of other values may be used.

Figure 7:
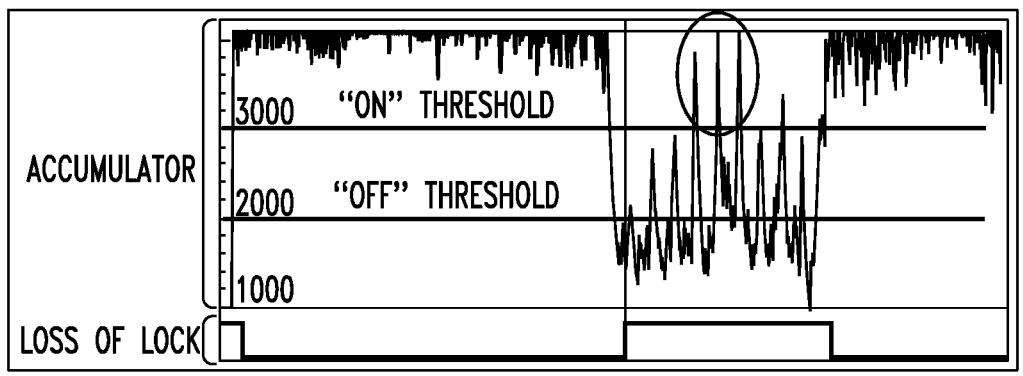
FIG. 7 illustrates the operation of the loss of lock detector of the FIG. 1 CDR system in one embodiment.

The operation of the loss of lock detector 102 is illustrated in FIG. 7, which shows the output of the accumulator 118, and corresponding changes in the logic level of the loss of lock signal, as a function of time. The "on" and "off" thresholds established for the hysteresis functionality of the digital LPF 120 are superimposed on the accumulator output. When the accumulated output value is above the "on" threshold for the minimum period of time established by the first counter, the loss of lock signal is at a logic low level indicative of a lock condition. When the accumulated output value is below the "off" threshold for the minimum period of time established by the second counter, the loss of lock signal is at a logic high level indicative of a loss of lock condition. It can be seen from the figure that the accumulator output exceeds the "on" threshold in the circled area, but not for sufficient periods of time to cause a change in the logic level of the loss of lock signal, due to the hysteresis functionality applied in the digital LPF 120.

Exemplary values for the "on" and "off" thresholds in the present embodiment are respective integer values of 3000 and 2000, although other values may be used in other embodiments.

The loss of lock detector 102 also includes delay circuitry 122 configured to control synchronous delay in processing periods of the UP/DN delta module 116 responsive to a programmable index offset. Such adjustments may be used to address the impact of dead zones associated with eye sampling imperfections, in which neither a phase up or phase down adjustment is indicated, as previously mentioned in conjunction with FIG. 6.

Other parameters of the loss of lock detector 102 can also be made programmable, such as, for example, the "on" and "off" thresholds associated with the above-described hysteresis functionality, and one or more parameters of the digital LPF 120, as well as various operating parameters of the accumulator 118.

The loss of lock detector 102 provides enhanced loss of lock detection accuracy in the presence of serial data stream jitter while also exhibiting reduced circuit complexity, relative to conventional loss of lock detection arrangements. For example, circuit complexity can be reduced in the present embodiment by avoiding the need for a significant number of additional slicers as in a conventional rotational detector arrangement. Moreover, the disclosed loss of lock detector is substantially less susceptible to error due to phase jitter than a conventional rotational detector arrangement.

The loss of lock signal generated by the loss of lock detector 102 can be utilized in a processing device to facilitate reacquisition of lock. For example, a given low-to-high transition in the loss of lock signal at the output of the loss of lock detector 102 can be used to control initiation of a relock procedure for the CDR system 100. Such a relock procedure may include resetting of an integral loop accumulator of the phase control loop 114 and restarting both proportional and integral loop gain from their respective highest values, thereby facilitating a new attempt to lock to the serial data stream. The CDR system 100 may be configured to shift proportional and integral loop gains down after lock to the serial data stream is achieved, in order to reduce loop self-jitter amplitude. In addition, equalizer controls in the receiver front end 106 may be adjusted in order to better open the serial data eye so as make the lock condition more easily achievable.

Figure 8:
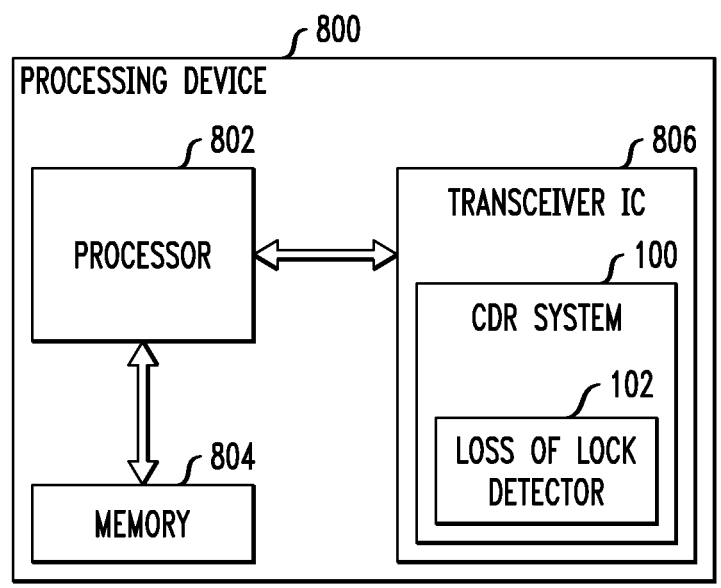
FIG. 8 shows an embodiment of a processing device that incorporates the FIG. 1 CDR system.

FIG. 8 shows an embodiment of a processing device 800 that incorporates the CDR system 100 and its associated loss of lock detector 102. In this embodiment, the processing device comprises a processor 802 coupled to a memory 804. Also coupled to the processor 802 is a transceiver integrated circuit (IC) 806 that includes the CDR system 100 and its associated loss of lock detector 102.

At least a portion of the functionality of the CDR 100 and the loss of lock detector 102 may be implemented as one or more processing modules, each comprising computer program code that is stored in the memory 804 and executed by the processor 802.

The processor 802 may comprise, for example, one or more microprocessors, application-specific integrated circuits (ASICs), field-programmable gate arrays (FPGAs), digital signal processors (DSPs), systems-on-chip (SOCs) or other types of processing circuitry, as well as portions or combinations of such elements.

The memory 804 may comprise, for example, electronic memory such as random access memory (RAM) or read-only memory (ROM), magnetic memory, optical memory or other types of storage elements, as well as portions or combinations of such elements. Memory elements of this type are considered examples of what are also referred to herein as computer-readable storage media that store computer program code, or more generally computer program products having executable program code embodied therein. Such program code when executed in the processor 802 causes the processing device 800 to perform functions associated with loss of lock detection in the manner disclosed herein.

As indicated previously, the processing device 800 may comprise, for example, a mobile telephone, a computer, or any other type of communication device in a wired or wireless communication system. The transceiver integrated circuit 806 may be configured to allow the processing device to communicate over one or more networks of such a communication system.

In other embodiments, a given processing device comprising CDR system 100 and its associated loss of lock detector 102 may be configured to process data read from a storage device, for example, in a read channel of an HDD.

It is to be appreciated that the diagram of FIG. 8 is simplified for purposes of illustration, and a variety of other types of additional or alternative processing device components may be utilized in a given embodiment. Conventional aspects of such components are well understood by those skilled in the art and therefore not described in detail herein.

The particular circuitry and processing module arrangement shown in FIG. 1 may be varied in other embodiments. Numerous alternative arrangements of hardware, software and firmware in any combination may be used to implement the described generation of a loss of lock signal.

As indicated above, CDR systems or portions thereof in accordance with embodiments of the invention may be implemented in the form of one or more integrated circuits suitable for installation within processing devices such as processing device 800. A given CDR system and its associated loss of lock detector may be implemented in the form of an integrated circuit, or as a combination of multiple integrated circuits.

In a given integrated circuit implementation, identical die are typically formed in a repeated pattern on a surface of a semiconductor wafer. Each die may include one or more loss of lock detectors as described herein, and may include other structures or circuits, such as related CDR systems or components thereof. The individual die are cut or diced from the wafer, then packaged as an integrated circuit. One skilled in the art would know how to dice wafers and package die to produce integrated circuits. Integrated circuits so manufactured are considered embodiments of the invention.

It should once again be emphasized that the embodiments described herein are intended to be illustrative only. For example, the particular arrangement of CDR system and loss of lock detector as shown in FIG. 1 may be varied in alternative embodiments. Also, other types of circuitry elements or processing modules may be used to implement loss of lock signal generation functionality as disclosed herein. The particular type of phase adjustment requests that are generated and the manner in which these phase adjustment requests are processed to provide a loss of lock signal may also be varied in other embodiments. These and numerous other alternative embodiments within the scope of the following claims will be readily apparent to those skilled in the art.

What is claimed is:

1. An apparatus comprising:
a clock and data recovery system; and
a loss of lock detector associated with the clock and data recovery system and configured to generate a loss of lock signal responsive to phase adjustment requests generated for a clock signal in the clock and data recovery system;
wherein the phase adjustment requests comprise a plurality of phase up requests and a plurality of phase down requests; and
wherein the loss of lock detector comprises majority vote circuitry configured to process a request group comprising multiple ones of the phase up and phase down requests and to replace the request group with a single phase up request if the number of phase up requests in the group exceeds the number of phase down requests in the group and to replace the request group with a single chase down request if the number of chase down requests in the group exceeds the number of phase up requests in the group.

2. The apparatus of claim 1 wherein the loss of lock signal has a first logic level indicative of the phase adjustment requests occurring at a first rate associated with a lock condition and a second logic level indicative of the phase adjustment requests occurring at a second rate lower than the first rate, the second rate being associated with a loss of lock condition.

3. The apparatus of claim 1 wherein the loss of lock detector is at least partially implemented within the clock and data recovery system.

4. The apparatus of claim 1 wherein the clock and data recovery system comprises:
slicer circuitry configured to sample a serial data stream;
a phase detector configured to process samples from the slicer circuitry; and
a phase control loop having an input coupled to an output of the phase detector and an output providing the clock signal to the slicer circuitry;
wherein the phase control loop is configured to lock the clock signal to the serial data stream; and
wherein the phase adjustment requests are generated by the phase detector and provided by the phase detector to the phase control loop.

5. The apparatus of claim 1 wherein the loss of lock detector comprises differencing circuitry configured to compute an absolute value of a phase increment associated with a corresponding subset of the phase up and phase down requests.

6. An apparatus comprising:
a clock and data recovery system; and
a loss of lock detector associated with the clock and data recovery system and configured to generate a loss of lock signal responsive to phase adjustment requests generated for a clock signal in the clock and data recovery system;
wherein the phase adjustment requests comprise a plurality of phase up requests and a plurality of phase down requests; and
wherein the loss of lock detector comprises an accumulator configured to accumulate absolute values of respective phase increments over an accumulation interval wherein the respective phase increments are associated with respective subsets of the phase up and phase down requests.

7. The apparatus of claim 6 wherein the loss of lock signal is generated at least in part as a function of an output signal of the accumulator.

8. The apparatus of claim 7 wherein the loss of lock signal has a first logic level indicative of a lock condition at least in part responsive to the output signal of the accumulator being above a first threshold and a second logic level indicative of a loss of lock condition at least in part responsive to the output signal of the accumulator being below a second threshold that is less than the first threshold.

9. The apparatus of claim 7 wherein the accumulator output signal is subject to at least one of a filtering operation and a hysteresis operation prior to generating the loss of lock signal therefrom.

10. The apparatus of claim 9 wherein the hysteresis operation applied to the accumulator output signal associates a first counter with a first threshold and a second counter with a second threshold that is less than the first threshold, and wherein the loss of lock signal has a first logic level indicative of a lock condition responsive to the output signal of the accumulator exceeding the first threshold for at least a minimum period of time defined by the first counter and has a second logic level indicative of a loss of lock condition responsive to the output signal of the accumulator falling below the second threshold for at least a minimum period of time defined by the second counter.

11. The apparatus of claim 10 wherein the first counter is reset when the output signal of the accumulator falls below the second threshold and the second counter is reset when the output signal of the accumulator exceeds the first threshold.

12. An apparatus comprising:
a clock and data recovery system; and
a loss of lock detector associated with the clock and data recovery system and configured to generate a loss of lock signal responsive to phase adjustment requests generated for a clock signal in the clock and data recovery system;
wherein the phase adjustment requests comprise a plurality of phase up requests and a plurality of phase down requests;
wherein the loss of lock detector comprises differencing circuitry configured to compute an absolute value of a phase increment associated with a corresponding subset of the phase up and phase down requests; and
wherein the loss of lock detector comprises delay circuitry configured to control synchronous delay in processing periods of the differencing circuitry responsive to a programmable index offset.

13. An integrated circuit comprising the apparatus of claim 1.

14. A method comprising:
generating phase adjustment requests for a clock signal in a clock and data recovery system, wherein generating phase adjustment requests comprises generating a plurality of phase up requests and a plurality of phase down requests; and
generating a loss of lock signal responsive to the plurality of phase up requests and the plurality of phase down requests;
wherein generating the loss of lock signal comprises processing a request group comprising multiple ones of the phase up and phase down requests so as to replace the request group with a single phase up request if the number of phase up requests in the group exceeds the number of phase down requests in the group and to replace the request group with a single phase down request if the number of phase down requests in the group exceeds the number of phase up requests in the group.

15. The method of claim 14 wherein generating the loss of lock signal further comprises computing in differencing circuitry an absolute value of a phase increment associated with a corresponding subset of the phase up and phase down requests.

16. A method comprising:
generating phase adjustment requests for a clock signal in a clock and data recovery system, wherein generating phase adjustment requests comprises generating a plurality of phase up requests and a plurality of phase down requests; and
generating a loss of lock signal responsive to the plurality of phase up requests and the plurality of phase down requests;
wherein generating the loss of lock signal comprises:
accumulating absolute values of respective phase increments over an accumulation interval; and
generating the loss of lock signal as a function of the accumulated phase increment absolute values;
wherein the respective phase increments are associated with respective subsets of the phase up and phase down requests.

17. The method of claim 16 wherein generating the loss of lock signal further comprises applying at least one of a filtering operation and a hysteresis operation to the accumulated phase increment absolute values prior to generating the loss of lock signal therefrom.

18. A computer program product comprising a non-transitory storage medium having executable computer program code embodied therein, wherein the computer program code when executed in a processing device causes the processing device to perform the steps of:
generating phase adjustment requests for a clock signal in a clock and data recovery system, wherein generating phase adjustment requests comprises generating a plurality of phase up requests and a plurality of phase down requests; and
generating a loss of lock signal responsive to the plurality of phase up requests and the plurality of phase down requests;
wherein generating the loss of lock signal comprises processing a request group comprising multiple ones of the phase up and phase down requests so as to replace the request group with a single phase up request if the number of phase up requests in the group exceeds the number of phase down requests in the group and to replace the request group with a single phase down request if the number of phase down requests in the group exceeds the number of phase up requests in the group.

19. The apparatus of claim 1 wherein logic levels of the loss of lock signal are indicative of respective rates of the phase adjustment requests.

20. The method of claim 15 wherein generating the loss of lock signal further comprises controlling synchronous delay in processing periods of the differencing circuitry responsive to a programmable index offset.

21. The method of claim 16 wherein generating the loss of lock signal further comprises:
computing in differencing circuitry an absolute value of a phase increment associated with a corresponding subset of the phase up and phase down requests; and
controlling synchronous delay in processing periods of the differencing circuitry responsive to a programmable index offset.

22. The method of claim 14, wherein generating the loss of lock signal further comprises:
accumulating absolute values of respective phase increments over an accumulation interval; and
generating the loss of lock signal as a function of the accumulated phase increment absolute values;
wherein the respective phase increments are associated with respective subsets of the phase up and phase down requests.

* * * * *